United States Patent [19]

Isobe

[11] Patent Number: 5,034,928
[45] Date of Patent: Jul. 23, 1991

[54] SEMICONDUCTOR MEMORY DEVICE HAVING TWO-DIMENSIONAL MATRIX ARRAY

[75] Inventor: Mitsuo Isobe, Tama, Japan

[73] Assignee: Kabushiki Kaisha Toshiba, Kawasaki, Japan

[21] Appl. No.: 383,212

[22] Filed: Jul. 21, 1989

[30] Foreign Application Priority Data

Jul. 22, 1988 [JP] Japan .................. 63-183313

[51] Int. Cl.$^5$ .............................................. G11C 8/00
[52] U.S. Cl. ............................ 365/230.03; 365/230.06
[58] Field of Search ........................ 365/230.03, 230.06

[56] References Cited

U.S. PATENT DOCUMENTS 4,429,374 1/1984 Tanimura ...................... 365/230.03
4,597,064 6/1986 Giebel ............................ 365/230.03

Primary Examiner—Joseph A. Popek
Attorney, Agent, or Firm—Foley & Lardner

[57] ABSTRACT

A semiconductor memory device has a memory cell matrix in which a plurality of memory cells are connected in rows by work lines and in columns by bit lines. The device comprises cell row groups each of which is formed by memory cell rows commonly activated by several row address signals at a first selection stage, a row group selection decoder having the smallest decoding circuits as a first stage decoder each connected to the row group(s) by first stage word line and commonly activating any group(s) at the first row selection stage by several row address signals, and a row selection decoder as a second stage decoder having the smallest decoding units entirely provided in the matrix and each activating any cell row(s) at a second selection stage by remaining row address signals.

7 Claims, 4 Drawing Sheets

SEMICONDUCTOR MEMORY DEVICE HAVING TWO-DIMENSIONAL MATRIX ARRAY

BACKGROUND OF THE INVENTION

The present invention relates to a semiconductor memory device having a plurality of memory cells arranged in a two-dimensional (row and column) matrix array, and more particularly relates to a semiconductor memory device having a large-scale storage capacity and high-speed operation for reading information out of memory cells by decoding signals for row selection in two stages.

The miniaturization and high performance of electronic apparatus have been accompanied by increasingly large-scale storage capacity and high-speed operation of semiconductor memory devices mounted on electronic apparatus.

At present, some semiconductor memory devices which have more than one million memories within a one square centimeter chip, and in which the access time is less than 50 nano-seconds ($5 \times 10^9$ sec). Furthermore, technological advancement continues to demand large-scale capacities and higher speed operation of semiconductor memory devices.

In a conventional semiconductor memory shown in FIG. 1, a device is basically comprised of memory cell arrays 10 which are constructed by a plurality of memory cells 11 respectively arranged in a matrix and each storing one piece of data, a row selection decoder 20 for selecting a desired word line 12 which connects a plurality of memory cells arranged in rows, and a column selection decoder (not shown) for selecting a desired bit line (not shown) which connects memory cells arranged in columns.

Decoding operation in the conventional semiconductor memory device shown in FIG. 1 is performed as follows. A plurality of address signal lines 21 supplies the row selection decoder 20 with different row address signals for causing the decoder 20 to select a specified word line 12 corresponding to one of the address signals. In the selected word line 12, the column selection decoder (not shown) selects the specified memory cell or cells 11 by column address signals.

A control circuit (not shown) controls the memory cell 11 selected by the above process for writing or reading data to or from the cell 11.

As shown in FIG. 2, the row selection decoder 20 comprises a decoder 22 such as a NOR logic circuit, buffers 23 and 24 such as NOT circuits.

However, when the conventional semiconductor memory device has a large-scale memory capacity, the memory cells 11 connected by one word line 12 increase, so that the capacitance C of the capacitor 25 shown in FIG. 2 increases in order to drive the decoder 22 and buffers 23 and 24. Accordingly, it is necessary that transistors of the buffers 23 and 24 be large, or of the bipolar type having a higher driving ability.

When the transistors of buffers 23 and 24 are large-sized, the area of memory cells and decoder has to be small even though the wiring patterns are miniaturized. Furthermore, use of the bipolar transistors requires a larger area than metal oxide semiconductor (MOS) type transistors even though the patterns are small-sized, so that it is difficult for the memory device to be large.

SUMMARY OF THE INVENTION

An object of the present invention is to provide a semiconductor memory device having a large capacity of memory cells and high-speed operation in reading and writing data from and to memory cells.

In order to achieve the above object of the present invention, a semiconductor memory device according to the present invention comprises a plurality of address signal lines provided for selecting a memory cell row in which a plurality of memory cells are connected by one word line, a plurality of row groups, each of which is formed by a plurality of memory cell rows commonly activated by address signals supplied to several lines, a plurality of group word lines for commonly connecting several row groups in order to commonly activate group selection decoders connected between each group word line and several signal lines in order to commonly activate several groups which are connected by the group word line by address signals, and row selection decoders connected to several remaining signal lines in order to commonly activate memory cells connected within one row.

By the preferred embodiment of the present invention, a memory cell matrix is divided in several blocks having several memory cell rows, and the group selection decoder is provided between several address signal lines and a group word line connecting several row groups.

Furthermore, the group selection decoders and/or row selection decoders are constructed of bipolar transistors by the preferred embodiment.

The semiconductor memory device according to the present invention has the following effects.

As the device of this invention has the two kinds of decoders of the group selection decoder and row selection decoder, and duplicate word lines, it is possible for the row selection decoder to be small because the capacitance C of a word line becomes smaller, so that it is possible that the semiconductor memory device has a large memory capacity.

Furthermore, as the size of the output lines of the group selection decoder are reduced, the device has enough room to accommodate any element, so that large-sized transistors can be used. It is also feasible to use bipolar transistors, which require comparatively large areas. Accordingly, it is possible for the semiconductor device to operate at high speed.

Therefore, even though the storage capacity and load capacitance of the buffer become large, the semiconductor memory device of the present invention is capable of high speed operation.

DETAILED DESCRIPTION OF THE PREFERRED EMBODIMENTS

Before examples of the invention are described in detail, the fundamental concept of the present invention will be schematically explained with reference to FIG. 3.

Figure 1:
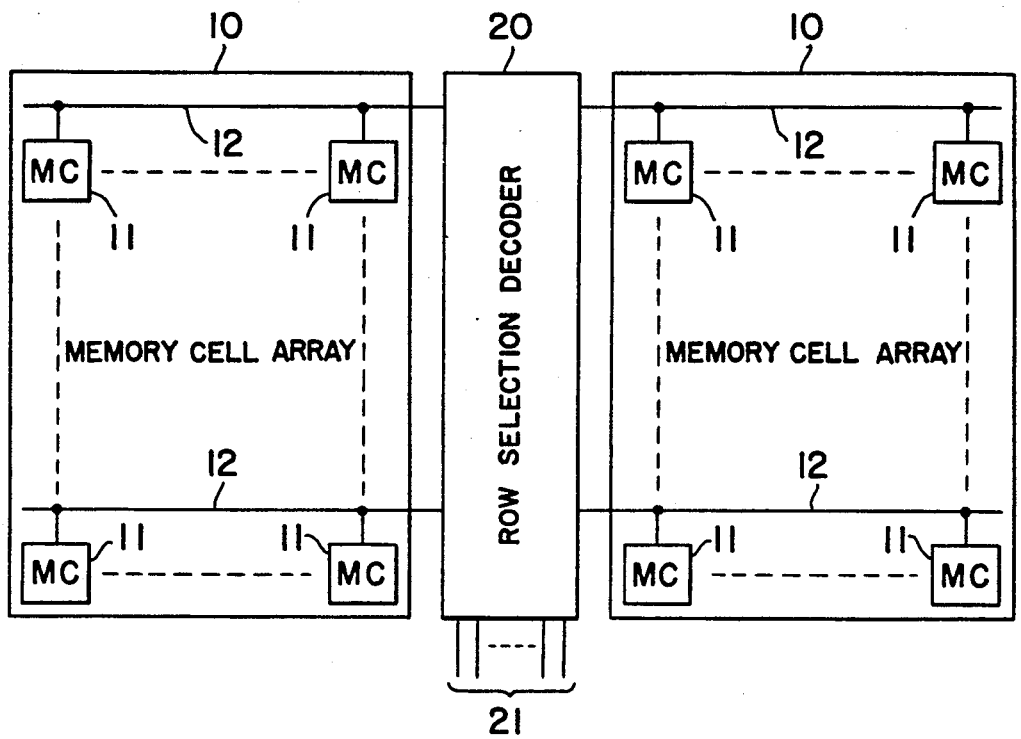
FIG. 1 is a block diagram showing a schematic configuration of a semiconductor memory device of the prior art.
Figure 2:
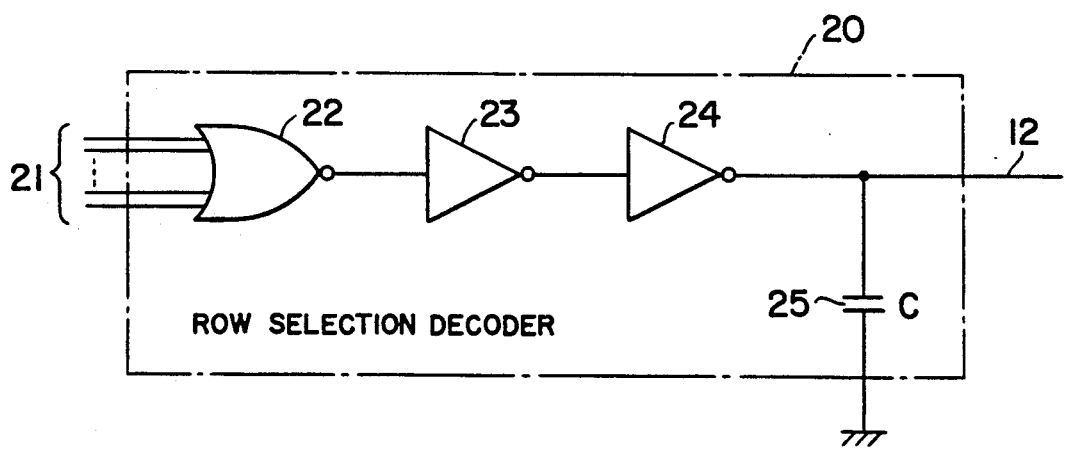
FIG. 2 is a circuit diagram showing the configuration of a row selection decoder of FIG. 1 with a buffer.
Figure 3:
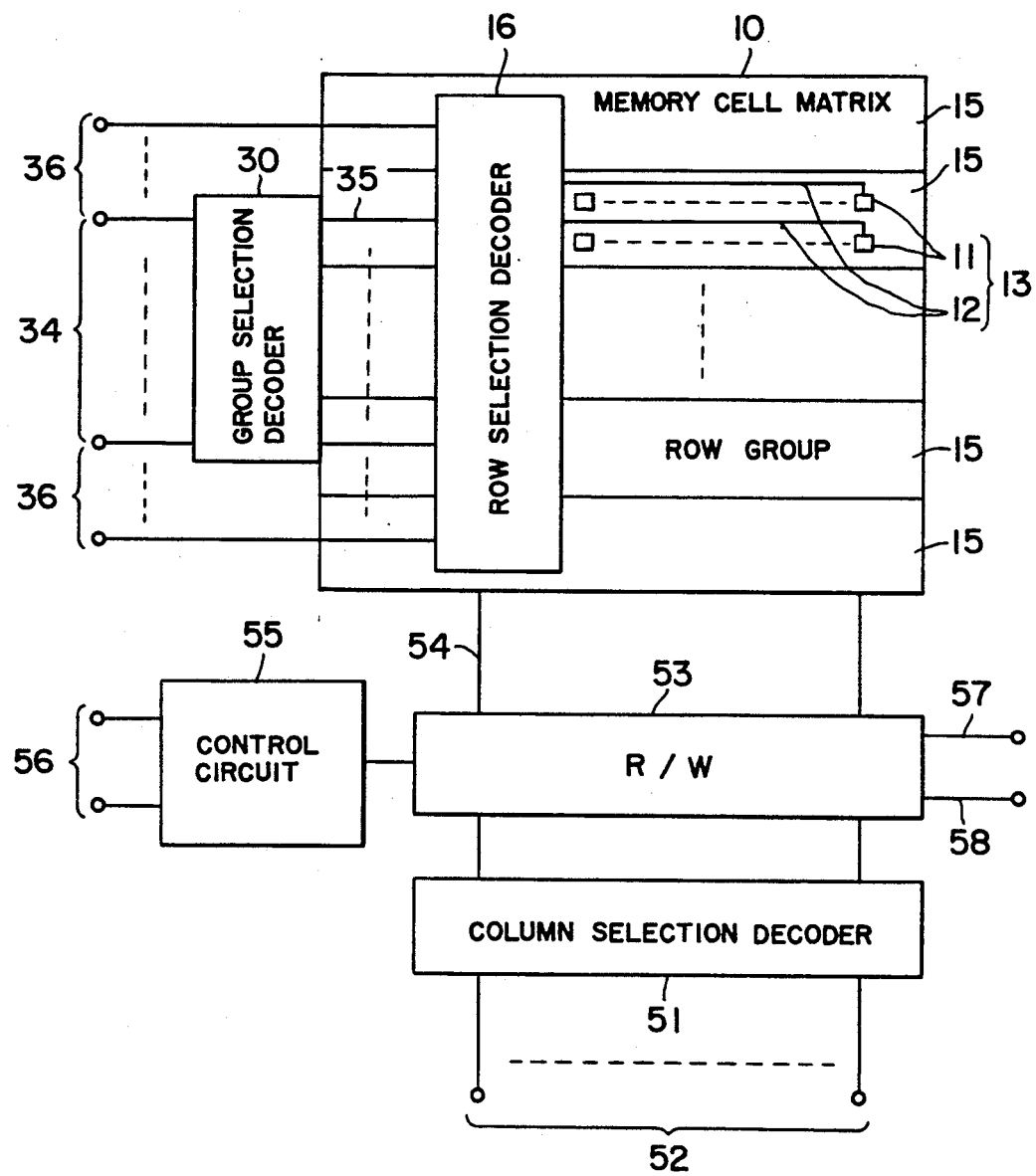
FIG. 3 is a block diagram showing the basic concept of a semiconductor memory device according to the present invention.

In FIG. 3, a memory device comprises a memory cell matrix 10, group selection decoders 30 as a first decoder, a column selection decoder 51 for selecting a cell and/or cells in a column direction, address signal lines for selecting cell(s) in a column direction, a reading/writing circuit 53 for storing and using data, bit lines 54 for cell access and reading/writing data, a control circuit 55 for controlling the circuit 53 by control signals via lines 56, a data output line 57, and a data input line 58. The elements 51-58 do not relate to the present invention. The cell matrix 10 has a plurality of row groups 15 each having a plurality of, for example, two or four memory cell rows 13.

The group selection decoder 30 receives several row address signals supplied through signal lines 34 and outputs group selection signals via word lines 35 of a first kind.

In the memory cell matrix 10, each row group 15 has a row selection decoder 16 as a second decoder, and the memory cell rows 13. Each row 13 is composed of a word line 12 of a second kind and a plurality of memory cells 11 connected by the line 12. The decoder 16 receives the group selection signals via the first word lines 35 and row address signals via remaining signal lines 36, and outputs a row selection signal(s) via the second word line(s) 12.

Conventionally, one word line is selected at the first selection stage, and then one row is selected at the second selection stage by an AND gate. For example, Japanese official gazette of patent application laid-open No. 58-211393 (1983) discloses duplicate word lines 3 and 15, decoders 4 for selecting any word line 15 at the first stage, and AND gates 16 for selecting the second stage word line 3 which has a one-to-one relation with the selected first word line 15.

However, by the present invention, one or more groups is/are selected at the first selection stage and then, one or more rows is/are selected at the selection stage. Namely, the first and second word lines 35 and 12 have the relation of one-to-several in the semiconductor memory device of the present invention.

As mentioned above, the fundamental concept is that the memory cell rows 13 are divided into several row groups and the row selection decoder selects the memory cell rows through two stages.

Next, preferred embodiments will be concretely explained with reference to FIGS. 4 and 5.

Figure 4:
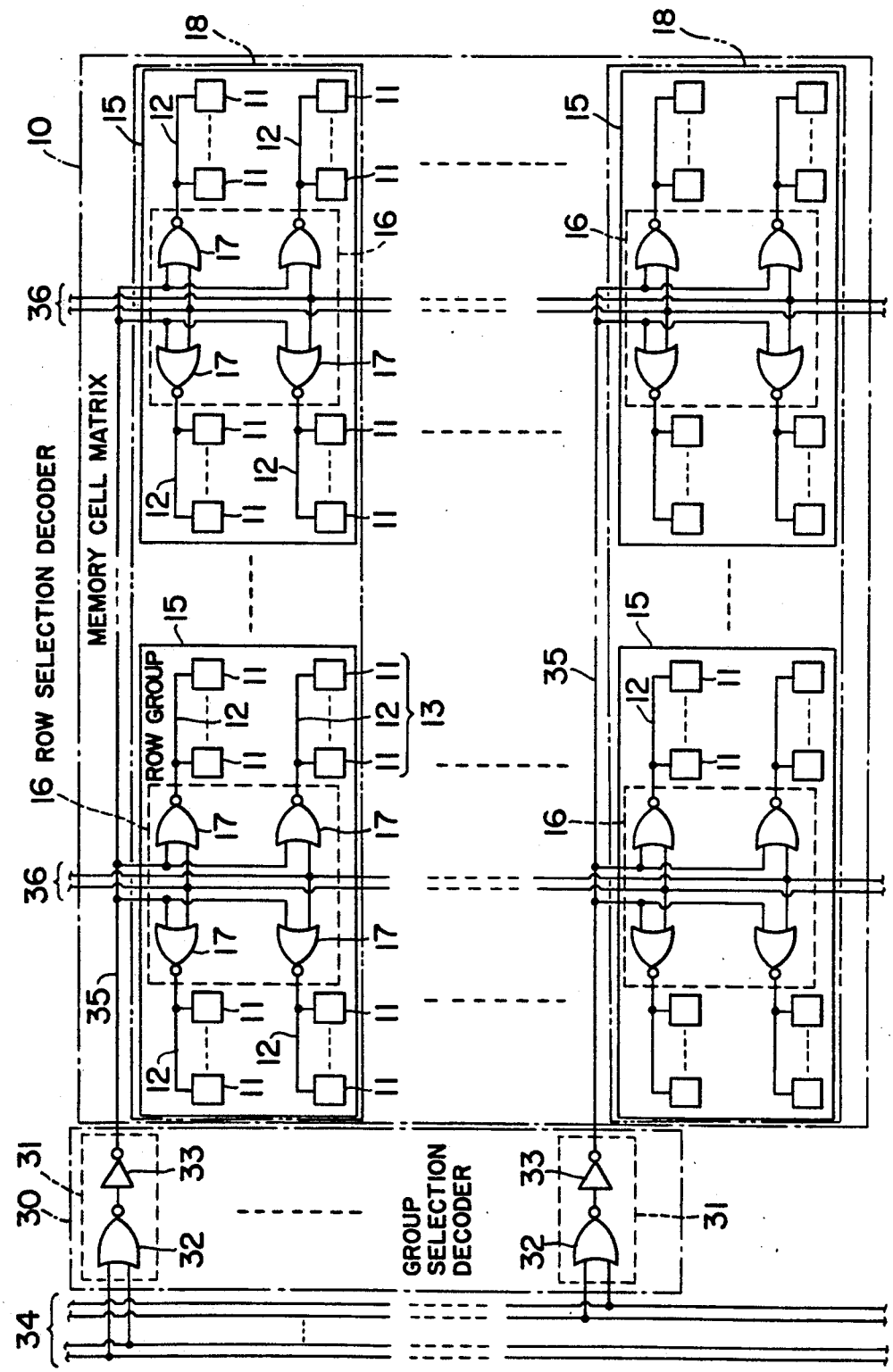
FIG. 4 is a circuit diagram showing the circuitry of a semiconductor device according to a first embodiment of the present invention.

FIG. 4 shows a first embodiment of the present invention. A semiconductor memory device according to the first embodiment comprises a group selection decoder 30 and a memory cell matrix 10. The group selection decoder 30 has a plurality of decoder circuits 31 as the first decoder. Each circuit 31 has a NOR logic circuit 32 as the smallest decoding unit to select the group, and a NOT logic circuit (an inverter) 33.

The matrix 10 comprises a plurality of row groups 15 each having memory cell rows 13. In each row group 15, a row selection decoder 16 comprises a plurality of NOR logic circuit 17 as the smallest decoding unit to select all the rows. The decoder circuits 17 each correspond to a memory cell row 13 having the second word line 12 and a plurality of memory cells 11 connected in the row direction by the word line 12.

The column direction cell selection decoder 51 to the data input line 58 are omitted in FIG. 4.

Now, the operation will be explained. The row address signals for group selection are supplied to the group selection decoder 30 through several row address signal lines 34. Via a few of the signal lines 34, the signals activate any decoder circuit(s) 31 so as to select any row group(s) 15. In the selected row group(s) 15, the row address signals supplied by the remaining address signal lines 36 activate an upper or lower two decoders 17 so as to select one row 13 of an upper or lower line of rows 13.

Lastly, a column address signal supplied by any bit line (not shown in FIG. 4) activates any memory cell 11 so as to read and write the necessary data.

Next, referring to FIG. 5, a semiconductor memory device according to the second embodiment of the present invention will be described.

Figure 5:
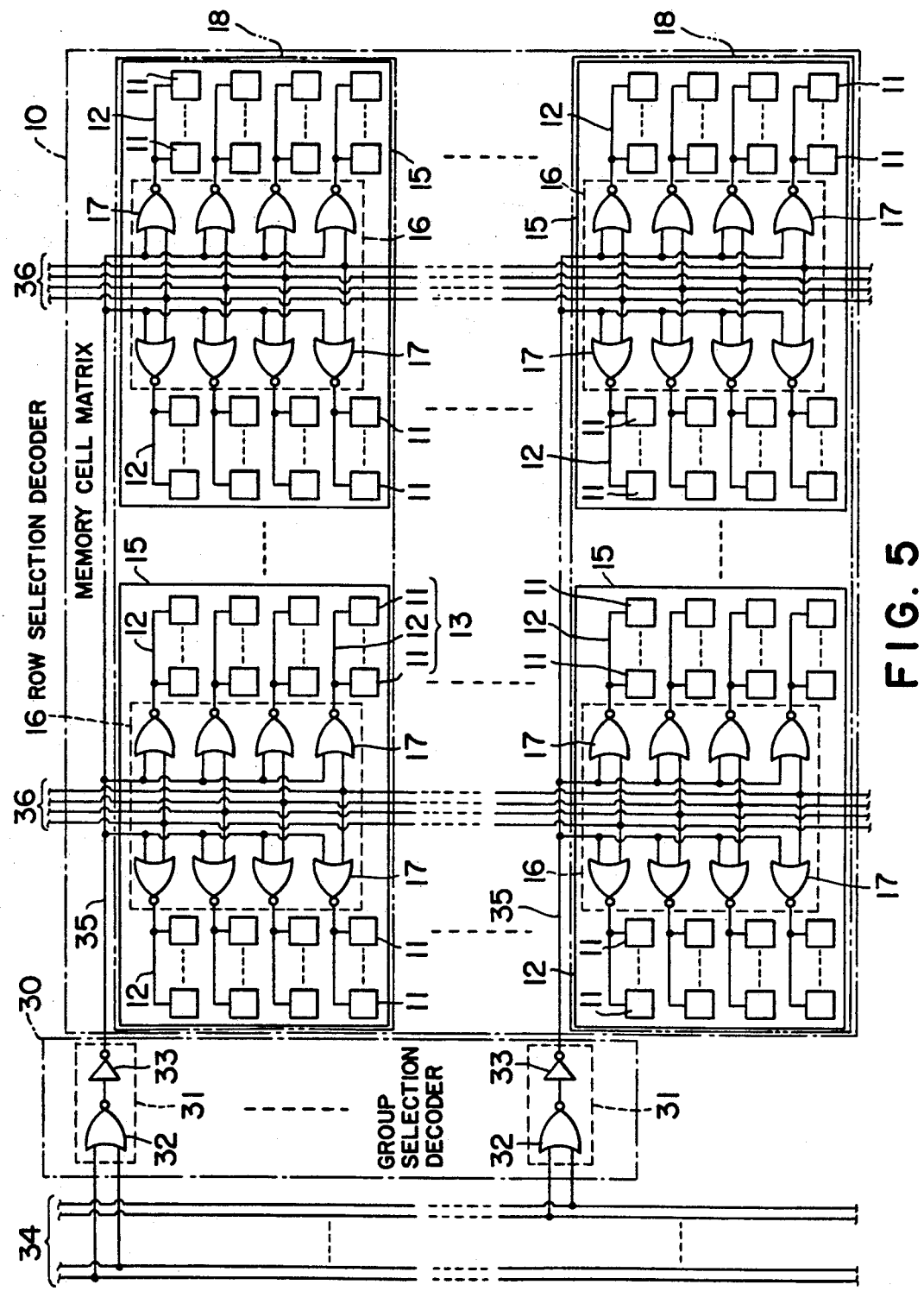
FIG. 5 is a circuit diagram showing the circuitry of a semiconductor device according to a second embodiment of the present invention.

As shown in FIG. 5, the device of the second embodiment comprises the group selection decoder 30 having the same configuration as the first embodiment, and row groups 15 each having four memory cell rows 13. In this embodiment, the second row address signals to select the desired row(s) 13 are supplied through four row address signal lines 36. Accordingly, the second selection stage is performed by eight decoder 17 as the smallest decoding unit.

Operation of the second embodiment is performed by two stage decoding in the same manner as in the first embodiment, but whereas only one row could be selected in the first embodiment, the second embodiment allows for one or more rows 13 to be selected at the second stage.

What is claimed is:

1. A semiconductor memory device having a memory cell matrix in which a plurality of memory cells are connected in rows by word lines and in columns by bit lines, a row selection decoder for activating an arbitrary cell row by a row address signal, and a column selection decoder for selecting desired cell arranged in a desired cell row activated by said row selection decoder so as to access a specified memory cell, the memory device comprising:

first row-address signal lines provided along one side of said memory cell matrix having a rectangular shape and for supplying a first row address signal to a cell group row selector;

said cell group row selector having a plural number of decoder circuits, one of which is selected by said first row address signal;

a plural number of cell row groups, each connected to a corresponding decoder circuit by a corresponding first word line and being activated by a cell group row activation signal from said decoder circuit when that decoder circuit is selected;

each cell row group having a plural number of cell groups having a plural number of cell rows;

second row-address signal lines positioned inside a boundary line of an area treated as said memory matrix and connected to a plural number of decoders symmetrically arranged in each cell group connected vertically by the second row-address signal line; and said cell rows symmetrically connected to corresponding decoders by corresponding second word lines and activated by cell row activation signals from corresponding decoders when those corresponding decoders are activated.

2. A memory device according to claim 1 wherein said cell row groups have respectively two memory cell rows, in each of which a plurality of said memory cells are connected by said second word line receiving a row selection signal from a decoder circuit on the basis of said second row address signals through the lines.

3. A memory device according to claim 1 wherein said cell row groups have respectively four memory cell rows, in each of which a plurality of said memory cells are connected by said second word line receiving a second row selection signal by a decoder circuit on the basis of said second row address signals through the lines.

4. A memory device according to claim 1, further comprising first and second stage decoders, wherein said first stage decoder activates any first stage word line so as to select one or more row group or groups and, then said row selection decoder as a said second stage decoder activates any second stage word line and/or lines so as to select one or more cell row or rows.

5. A memory device according to claim 1, further comprising a first and second stage decoders, wherein said first stage decoder selects one first word line at a first word line selection stage and then, said second stage decoder selects one or more cell row of rows among a plurality of said cell rows in one or more row group of groups.

6. A memory device according to claim 1, wherein at least said memory cell matrix is constructed in one chip, and said row selection decoder is also constructed in said memory cell matrix.

7. A memory device according to claim 6, wherein said row selection decoder has a plurality of said decoder circuits which are provided in said memory cell matrix along both sides of several row address signal lines for supplying remaining row address signals.

* * * * *